(12) United States Patent
Lin

(10) Patent No.: US 12,142,613 B2
(45) Date of Patent: Nov. 12, 2024

(54) ARRAY SUBSTRATE

(71) Applicant: HannsTouch Solution Incorporated, Tainan (TW)

(72) Inventor: Sheng-Chia Lin, Tainan (TW)

(73) Assignee: HANNSTOUCH SOLUTION INCORPORATED, Tainan (TW)

( * ) Notice: Subject to any disclaimer, the term of this patent is extended or adjusted under 35 U.S.C. 154(b) by 324 days.

(21) Appl. No.: 17/695,860

(22) Filed: Mar. 16, 2022

(65) Prior Publication Data
US 2023/0299090 A1 Sep. 21, 2023

(51) Int. Cl.
*H01L 27/12* (2006.01)
(52) U.S. Cl.
CPC .................... *H01L 27/124* (2013.01)
(58) Field of Classification Search
None
See application file for complete search history.

(56) References Cited

U.S. PATENT DOCUMENTS

| | | | | |
|---|---|---|---|---|
| 2013/0278487 | A1* | 10/2013 | Hou | G09G 3/18 345/87 |
| 2014/0061818 | A1* | 3/2014 | Zhang | H01L 27/1244 257/390 |
| 2022/0384697 | A1* | 12/2022 | Lin | H01L 33/62 |

FOREIGN PATENT DOCUMENTS

CN 105372891 A * 3/2016 ....... G02F 1/136286

* cited by examiner

*Primary Examiner* — Peter M Albrecht
(74) *Attorney, Agent, or Firm* — Winston Hsu

(57) ABSTRACT

An array substrate includes a substrate, a plurality of first signal lines, a plurality of traces, a plurality of second signal lines, and a plurality of switching elements. The first signal lines are disposed on the substrate along a first direction. The traces are disposed on the substrate along a second direction different from the first direction, and one trace is electrically connected to one first signal line and crosses another one first signal line. The second signal lines are disposed on the substrate along the second direction, the second signal lines cross the first signal lines, and the traces and the second signal lines are formed of different conductive layers. The switching elements are disposed on the substrate, and one of the switching elements is electrically connected to a corresponding one first signal line and a corresponding one second signal line.

15 Claims, 10 Drawing Sheets

ARRAY SUBSTRATE

BACKGROUND OF THE INVENTION

1. Field of the Invention

The present invention relates to an array substrate, and more particularly to an array substrate applied to an electronic device with narrow border.

2. Description of the Prior Art

In order to meet requirements in good-looking appearance and space utilization, display devices have developed to have reduced border width. The general approach to reduce the border width is to move the traces originally located in a peripheral region to a display region. However, this approach will increase the number of signal lines in the display region, thus increasing the coupling capacitance between adjacent signal lines and further affecting the display quality. Therefore, how to meet both the requirements of narrow border and maintaining the display quality is an objective of the skilled people in this field.

SUMMARY OF THE INVENTION

An embodiment of the present invention provides an array substrate, which includes a substrate, a plurality of first signal lines, a plurality of traces, a plurality of second signal lines, and a plurality of switching elements. The first signal lines are disposed on the substrate along a first direction. The traces are disposed on the substrate along a second direction different from the first direction, and one of the traces is electrically connected to one of the first signal lines. The one of the traces crosses and is electrically insulated from another one of the first signal lines, and the traces are formed of a first conductive layer. The second signal lines are disposed on the substrate along the second direction, the second signal lines cross the first signal lines, and the second signal lines are formed of a second conductive layer different from the first conductive layer. The switching elements are disposed on the substrate, and one of the switching elements is electrically connected to a corresponding one of the first signal lines and a corresponding one of the second signal lines.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
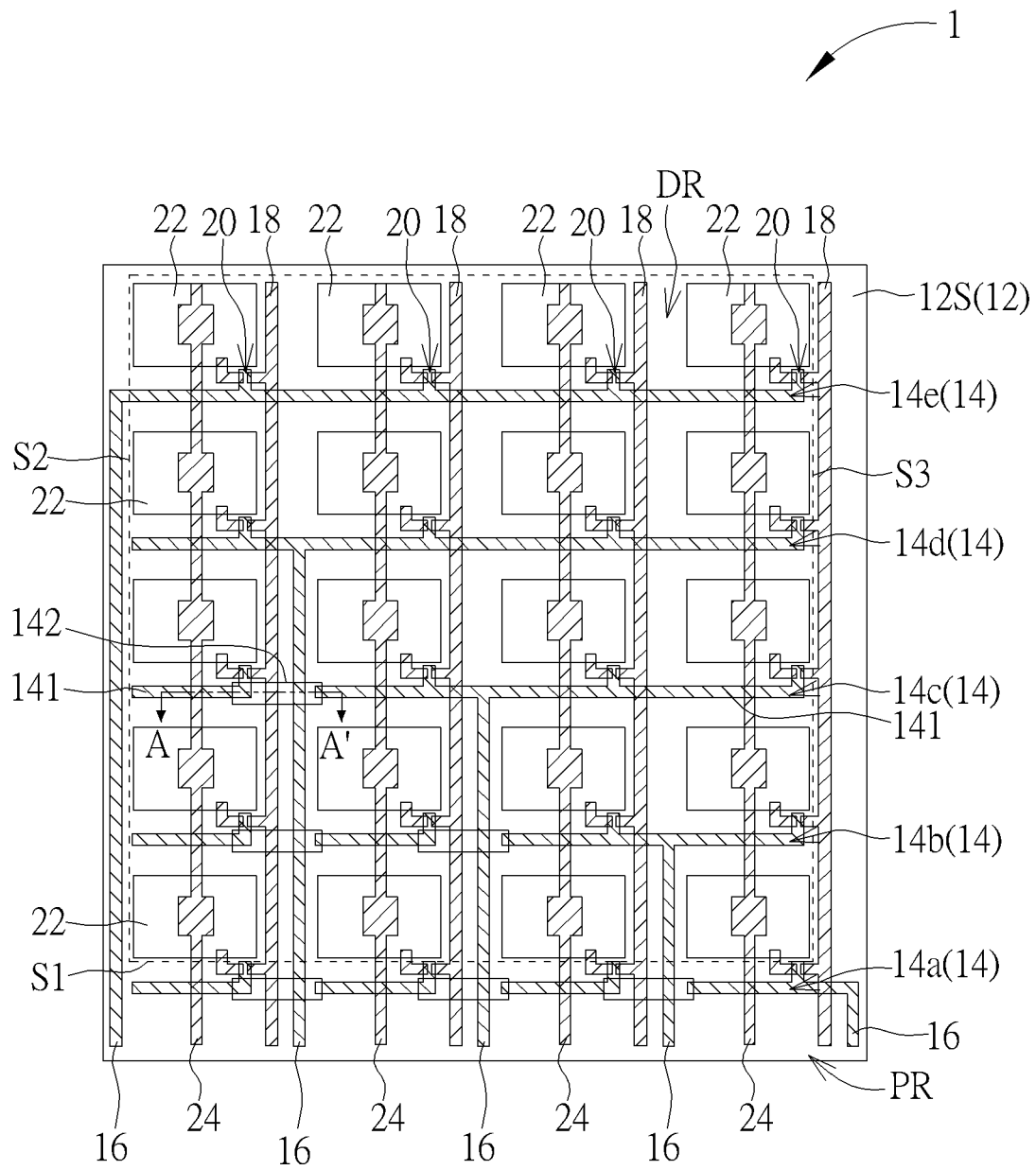
FIG. 1 schematically illustrates a plan view of an array substrate according to a first embodiment of the present invention.
Figure 1:
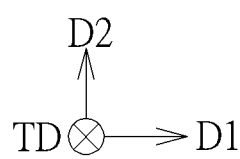

The contents of the present invention will be described in detail with reference to specific embodiments and drawings. It is noted that, for purposes of illustrative clarity and being easily understood by the readers, the following drawings may be simplified schematic diagrams, and elements therein may not be drawn to scale. The numbers and dimensions of the elements in the drawings are just illustrative and are not intended to limit the scope of the present invention.

In the present invention, the array substrate may be applied to an electronic device that needs a pixel array. For example, the electronic device may be a display device, an image sensing device, an X-ray sensing device, or other suitable devices. The display device may be, for example, a non-self-luminous display device or a self-luminous display device. The non-self-emissive display device may include, for example, a liquid crystal display device or other suitable devices, and the self-emissive display device may include, for example, an organic light-emitting diode display device, an inorganic light-emitting diode display device, or other suitable devices. Depending on the types of the display devices, the display device may include other substrates and/or elements in addition to the array substrate. For example, when the display device is the liquid crystal display device, the display device may include an array substrate, a color filter substrate and a liquid crystal layer, and the liquid crystal layer may be disposed between the color filter substrate and the array substrate, but not limited thereto. When the display device is the self-luminous display device, the display device may include the array substrate, light emitting diodes and an encapsulation layer, in which the light emitting diodes and the encapsulation layer are disposed on the array substrate, but not limited thereto. The array substrate in the following description is applied to a display device as an example, but not limited thereto.

Figure 2:
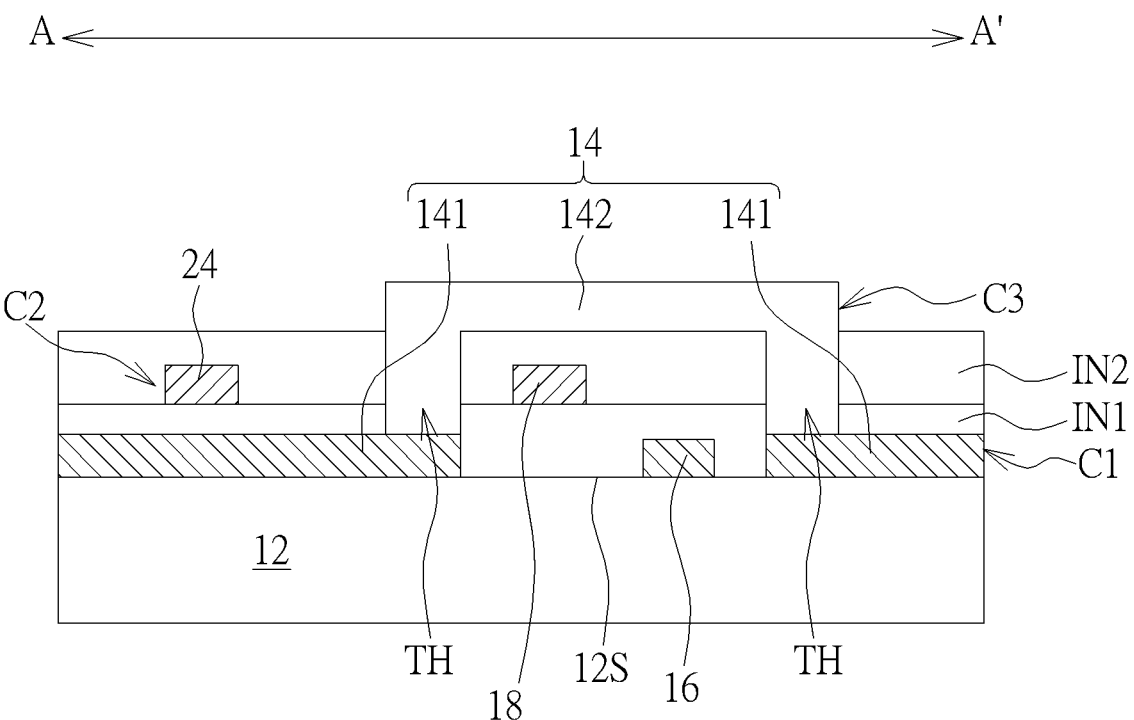
FIG. 2 schematically illustrates a cross-sectional view of FIG. 1 taken along a line A-A'.
Figure 2:
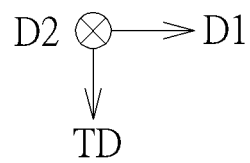

Refer to FIG. 1 and FIG. 2, in which FIG. 1 schematically illustrates a plan view of an array substrate according to a first embodiment of the present invention, and FIG. 2 schematically illustrates a cross-sectional view of FIG. 1 taken along a line A-A'. For clarity, FIG. 1 and FIG. 2 only show some elements of the array substrate, but the array substrate of the present invention is not limited thereto. As shown in FIG. 1, the array substrate 1 may include a substrate 12, a plurality of first signal lines 14, a plurality of traces 16, a plurality of second signal lines 18, and a plurality of switching elements 20. The substrate 12 may be used to carry the first signal lines 14, the traces 16, the second signal lines 18, and the switching elements 20. For example, the substrate 12 may be a flexible substrate or a non-flexible substrate. The substrate 12 may include, for example, glass, quartz, sapphire, acrylic, polyimide (PI), other suitable materials, or a combination of the mentioned above, but not limited herein. When the array substrate 1 is applied to a display device, the array substrate 1 may have a display region DR used for displaying an image and a peripheral region PR, in which the peripheral region PR may be located on at least one side of the display region DR. In the embodiment of FIG. 1, the peripheral region PR may surround the display region DR, but not limited thereto. The display region DR of the array substrate 1 may for example correspond to the display region of the display device, but not limited to. In the embodiment of FIG. 1, the array substrate 1 may further include a plurality of pixel electrodes 22 disposed on the substrate 12. The pixel electrodes 22 may be arranged in the display region DR, for example, in an array formation, and define positions of pixels of the display device. For example, the display region DR may be defined by a black matrix of the display device or may be approximately the same as a region surrounded by connecting lines of outer sides of the outermost pixel electrodes 22, but not limited thereto.

As shown in FIG. 1, when viewed along a plan view direction TD perpendicular to an upper surface 12S of the substrate 12, the first signal lines 14 and the traces 16 may be disposed in the display region DR, the first signal lines 14 may be disposed on the substrate 12 along the first direction D1, and the traces 16 may be disposed on the substrate 12 along a second direction D2 different from the first direction D1, in which each trace 16 may be electrically connected to the corresponding first signal line 14, and at least one trace 16 may cross and be electrically insulated from at least one of other non-corresponding first signal lines 14 (i.e., at least one of the first signal lines 14 that is not electrically connected to the at least one trace 16). Specifically, the at least one first signal line 14 crossed by the at least one trace 16 may include at least two line segments 141 and at least one bridge segment 142, and the bridge segment 142 and the traces 16 may be formed of different conductive layers, so that the at least one trace 16 may cross and be electrically insulated from the at least one bridge segment 142 by an insulating layer, and the traces 16 may be prevented from being electrically connected to the non-corresponding first signal lines 14. In the embodiment of FIG. 1, the bridge segment 142 may, for example, be electrically connected between the line segments 141, but not limited thereto.

For example, as shown in FIG. 1, the first signal lines 14 may include a first signal line 14a, a first signal line 14b, a first signal line 14c, a first signal line 14d, and a first signal line 14e sequentially arranged along the second direction D2. The first signal line 14a may include, for example, four line segments 141 and three bridge segments 142, and the line segments 141 and the bridge segments 142 are alternately connected in sequence. The first signal line 14b may include, for example, three line segments 141 and two bridge segments 142, and the line segments 141 and the bridge segments 142 are alternately connected in sequence. The first signal line 14c may include, for example, two line segments 141 and one bridge segment 142, and the bridge segment 142 is connected between the line segments 141. Accordingly, one of the traces 16 connected to one of the line segments 141 of the first signal line 14b may cross one of the bridge segments 142 of the first signal line 14a; another one of the traces 16 connected to one of the line segments 141 of the first signal line 14c may cross one of the bridge segments 142 of the first signal line 14b and another one of the bridge segments 142 of the first signal line 14a; and another one of the traces 16 connected to the first signal line 14d may cross another one of the bridge segments 142 of the first signal line 14a, another one of the bridge segments 142 of the first signal line 14b, and one of the bridge segments 142 of the first signal line 14c, such that most of the traces 16 may extend into the peripheral region PR through a first side S1 of the display region DR. In the embodiment of FIG. 1, the display region DR may have a second side S2 adjacent to the first side S1, and another one of the traces 16 connected to the first signal line 14e may be disposed between the second side S2 of the display region DR and a side of the substrate 12, so that the first signal line 14e may not cross the non-corresponding first signal lines 14. In this case, the first signal line 14d and the first signal line 14e may be respectively formed of a single line segment 141, but not limited thereto. In some embodiments, another one of the traces 16 connected to the first signal line 14a may be disposed between, for example, a third side S3 of the display region DR opposite to the second side S2 and another side of the substrate 12 corresponding to the third side S3, but not limited thereto. It is noted that since most of the traces 16 may extend into the peripheral region PR through the first side S1 of the display region DR, the number of the traces 16 located in the peripheral region PR on the second side S2 and the third side S3 of the display region DR are greatly reduced, thereby reducing the widths of the peripheral region PR located on the second side S2 and the third side S3 of the display region DR.

In some embodiments, the traces 16 and the line segments 141 may be formed of the same conductive layer, so that the traces 16 may be directly connected to the corresponding line segments 141 of the first signal lines 14 respectively, but not limited thereto. As shown in FIG. 2, the traces 16 and the line segments 141 may be formed of, for example, the first conductive layer C1, and the bridge segments 142 may be formed of, for example, the third conductive layer C3, but not limited thereto.

As shown in FIG. 1, the second signal lines 18 may be disposed in the display region DR and disposed on the substrate 12 along the second direction D2, and the second signal lines 18 may cross and be electrically insulated from the first signal lines 14. In the embodiment of FIG. 1, the second signal lines 18 may cross the bridge segments 142, and the second signal lines 18 and the bridge segments 142 may be formed of different conductive layers, so that the second signal lines 18 may be electrically insulated from the bridge segments 142. As shown in FIG. 2, the second signal lines 18 may be formed of, for example, a second conductive layer C2 different from the first conductive layer C1. In the embodiment of FIG. 1, when viewed along the plan view direction TD, the traces 16 and the second signal lines 18 may be alternately arranged along the first direction D1, but not limited thereto. In some embodiments, at least one trace 16 may be disposed between two adjacent second signal lines 18. For example, one of the traces 16 and one of the second signal lines 18 may be disposed between the pixel electrodes 22 of two adjacent columns, but not limited thereto. In some embodiments, one of the second signal lines 18 of FIG. 1 may be disposed on the right or left side of the pixel electrodes 22 of a corresponding one column, but not limited thereto.

As shown in FIG. 1, the switching elements 20 may be disposed on the substrate 12, and the switching elements 20 may be disposed at the crossings of the second signal lines 18 and the first signal lines 14 respectively and are electrically connected to the corresponding first signal lines 14 and the corresponding second signal lines 18. For example, the first signal lines 14 may be scan lines electrically connected to gates of the corresponding switching elements 20 respectively. The second signal lines 18 may be data lines electrically connected to sources (drains) of the corresponding switching elements 20 respectively. The pixel electrodes 22 may be respectively electrically connected to drains (sources) of the switching elements 20. In some embodiments, the first signal lines 14 and the second signal lines 18 may be exchanged. Although not shown, the switching elements 20 may further include a semiconductor layer and a gate insulating layer. In the embodiment of FIG. 1, the switching elements 20 may be, for example, bottom gate type thin film transistors, but not limited thereto. For example, the gates of the switching elements 20 may be formed of the same conductive layer as the line segments 141 of the first signal line 14 and the traces 16, such as the first conductive layer C1 shown in FIG. 2. The sources (drains) and the drains (sources) of the switching elements 20 may be formed of the same conductive layer as the second signal lines 18, such as the second conductive layer C2 shown in FIG. 2. In some embodiments, the switching elements 20 may be other types of thin film transistors according to the requirements.

As shown in FIG. 2, the first conductive layer C1 may be disposed between the substrate 12 and the second conductive layer C2, an insulating layer IN1 may be disposed between the first conductive layer C1 and the second conductive layer C2, and an insulating layer IN2 may be disposed on the second conductive layer C2 and the insulating layer IN1. The bridge segments 142 may be disposed on the insulating layer IN2 and be formed of the third conductive layer C3 different from the first conductive layer C1 and the second conductive layer C2. The insulating layer IN1 and the insulating layer IN2 may have a plurality of through holes TH, such that the bridge segments 142 may be electrically connected to the corresponding line segments 141 through the through holes TH respectively. In this way, the traces 16 and the second signal lines 18 may be electrically insulated from the bridge segments 142 by the insulating layer IN1 and the insulating layer IN2. In some embodiments, the first conductive layer C1 and the second conductive layer C2 may, for example, include metal or other suitable conductive materials. The third conductive layer C3 may, for example, include transparent conductive material, metal or other suitable conductive materials. In some embodiments, when the third conductive layer C3 includes the transparent conductive material, the pixel electrodes 22 may be formed of, for example, the third conductive layer C3, but not limited thereto. In some embodiments, the pixel electrodes 22 may be formed of another conductive layer disposed on the insulating layer IN2 and different from the third conductive layer C3, but not limited thereto.

As shown in FIG. 1 and FIG. 2, it is noted that the traces 16 and the second signal lines 18 may be respectively formed of the first conductive layer C1 and the second conductive layer C2 different from each other, so that as compared with the traces 16 and the second signal lines 18 being formed of the same conductive layer, the insulating layer IN1 may be present between the traces 16 and the second signal lines 18. A distance between one of the traces 16 and one of the second signal lines 18 adjacent to each other when viewed from the plan view direction TD may be reduced to improve pixel aperture ratio under a condition of maintaining a certain coupling capacitance, and/or the coupling capacitances between the traces 16 and the second signal lines 18 may also be reduced to decrease abnormality of the display device, thereby improving the display quality. In addition, since the traces 16 and the pixel electrodes 22 may be respectively formed of the first conductive layers C1 and third conductive layers C3 different from each other, interference between signals in the traces 16 and the pixel electrodes 22 may be reduced.

In the embodiment of FIG. 1, the array substrate 1 may further include a plurality of common lines 24 disposed on the substrate 12, and the common lines 24 may extend along the second direction D2 and cross the first signal lines 14, but not limited thereto. For example, the common lines 24 may cross the line segments 141 of the first signal lines 14, but not limited thereto. As shown in FIG. 2, the common lines 24 may be formed of the second conductive layer C2 and thus may be electrically insulated from the line segments 141 by the insulating layer IN1. In addition, as shown in FIG. 1, in the plan view direction TD, one of the common lines 24 may cross the pixel electrodes 22 in the same column and overlap the pixel electrodes 22 arranged in the same column to form storage capacitors with the pixel electrodes 22.

Figure 3:
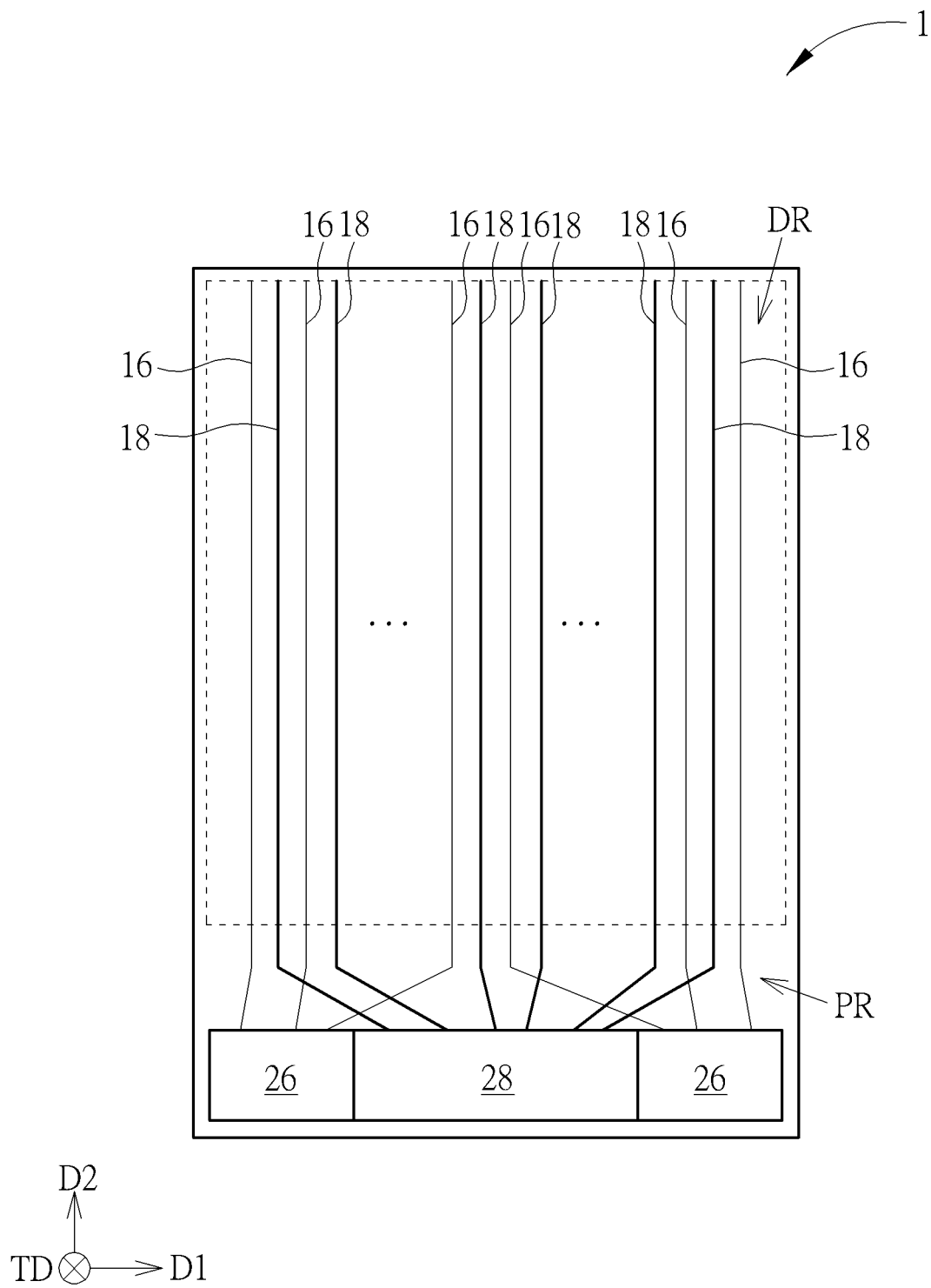
FIG. 3 schematically illustrates a plan view of an array substrate according to some embodiments of the present invention.

FIG. 3 schematically illustrates a plan view of an array substrate according to some embodiments of the present invention. In order to clearly illustrate elements in the peripheral region PR, most of the elements in the display region DR are omitted in FIG. 3, and only the traces 16 and the second signal lines 18 are shown, but the present disclosure is not limited thereto. As shown in FIG. 3, the array substrate 1 may further include a gate driving circuit 26 and a data driving circuit 28, in which the gate driving circuit 26 may be electrically connected to the traces 16, and the data driving circuit 28 may be electrically connected to the second signal lines 18. It should be noted that since the traces 16 and the second signal lines 18 are respectively formed of different conductive layers (e.g., the first conductive layer C1 and the second conductive layer C2 shown in FIG. 2 respectively), the traces 16 and the second signal lines 18 extending to the peripheral region PR may be directly connected to the gate driving circuit 26 and the data driving circuit 28, respectively, without any additional bridge structure. In other words, at least one of the traces 16 may directly cross one of the second signal lines 18 in the peripheral region PR. In some embodiments, the array substrate 1 may include two gate driving circuits 26, and the data driving circuits 28 may be disposed between the gate driving circuits 26, but not limited thereto.

The array substrate is not limited to the above embodiments and may include other embodiments. To simplify the description, other embodiments will be labeled with the same reference numerals as the first embodiment. In order to easily compare the differences between the first embodiment and other embodiments, the differences between different embodiments will be mentioned below, and repeated parts will not be described redundantly.

Figure 4:
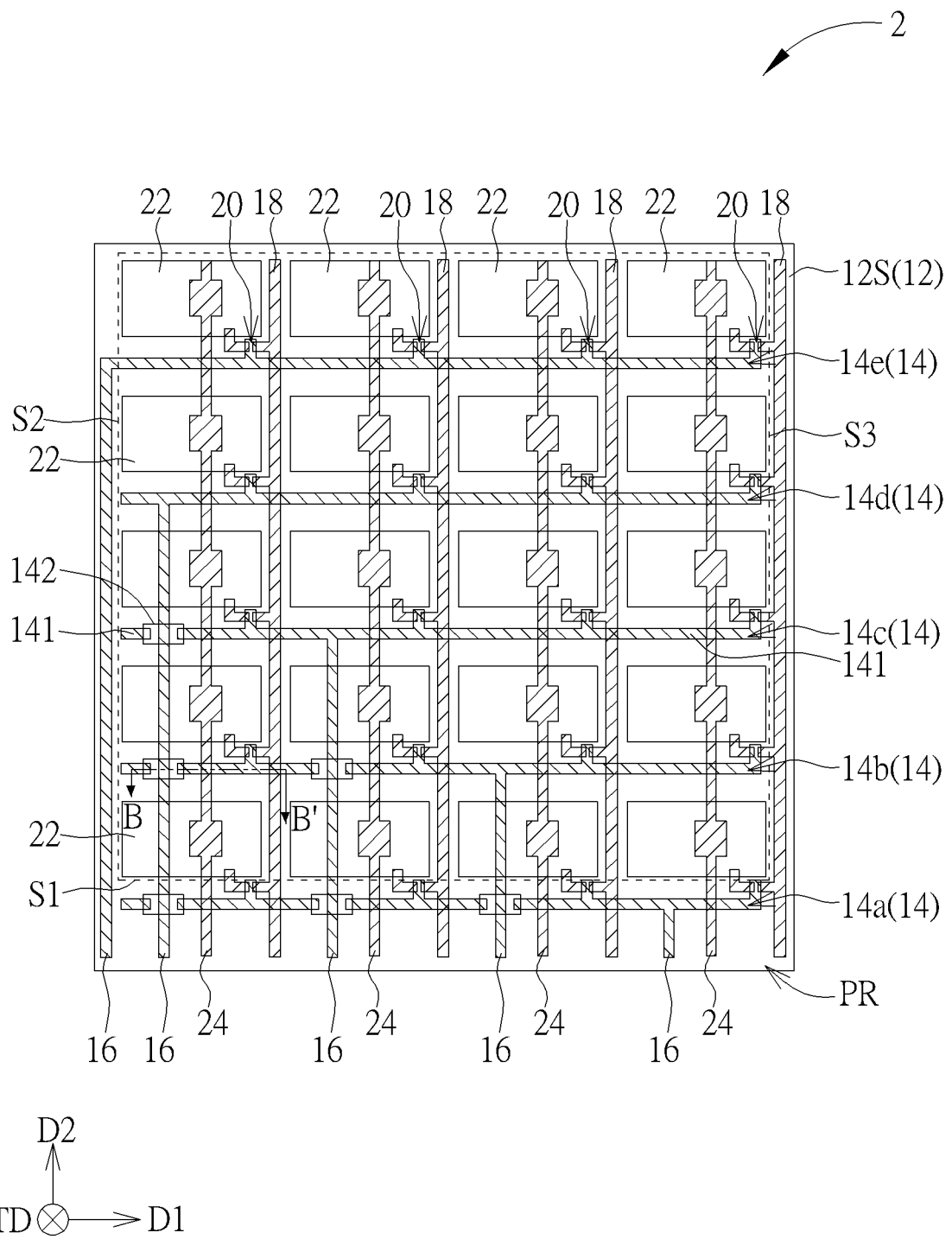
FIG. 4 schematically illustrates a plan view of an array substrate according to a second embodiment of the present invention.
Figure 5:
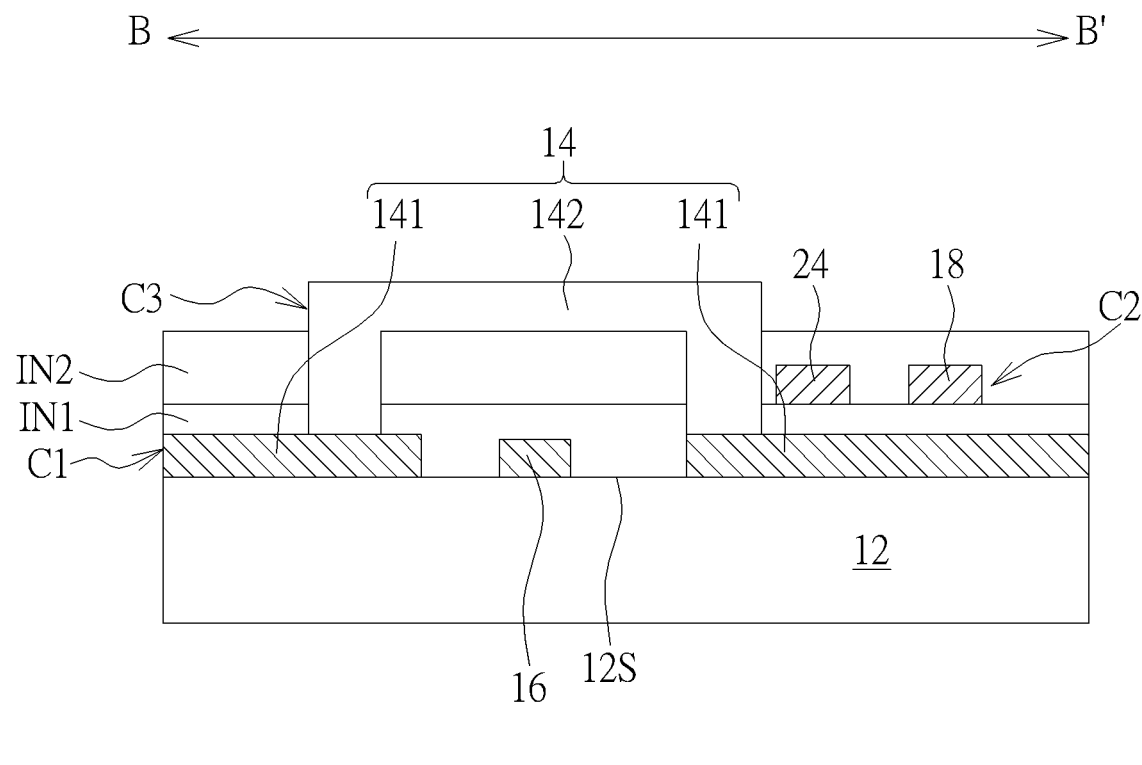
FIG. 5 schematically illustrates a cross-sectional view of FIG. 4 taken along a line B-B'.

FIG. 4 schematically illustrates a plan view of an array substrate according to a second embodiment of the present invention, and FIG. 5 schematically illustrates a cross-sectional view of FIG. 4 taken along a line B-B'. As shown in FIG. 4 and FIG. 5, the difference between the array substrate 2 of this embodiment and the array substrate 1 shown in FIG. 1 is that at least one trace 16 of this embodiment may cross at least one pixel electrode 22. For example, one of the traces 16 connected to the first signal line 14d may cross the pixel electrodes 22 arranged in the same column and located between the first signal line 14d and the first side S1 of the display region DR, and so on. Furthermore, the positions of the bridge segments 142 of the first signal lines 14 in the first direction D1 may be adjusted based on the positions of the traces 16 in the first direction D1. In some embodiments, one of the common lines 24 may be disposed between one of the second signal lines 18 and one of the traces 16 adjacent to each other, but not limited thereto. In some embodiments, the bridge segments 142 of FIG. 4 and FIG. 5 may be formed of the second conductive layer C2, and in this case, the bridge segments 142 may be formed of the same conductive layer as the common lines 24 and the second signal lines 18. In some embodiments, because the second signal lines 18 and the line segments 141 of the first signal lines 14 are formed of different conductive layers, each of the second signal lines 18 may respectively cross a corresponding one of the line segments 141 of the first signal lines 14, but not limited thereto. In some embodiments, the array substrate 2 shown in FIG. 4 may optionally adopt the structure of the gate driving circuit 26 and the data driving circuit 28 shown in FIG. 3. In some embodiments, other parts of the array substrate 2 of FIG. 4 may be similar or identical to the array substrates of other embodiments described above or below, so they will not be described in detail herein.

Figure 6:
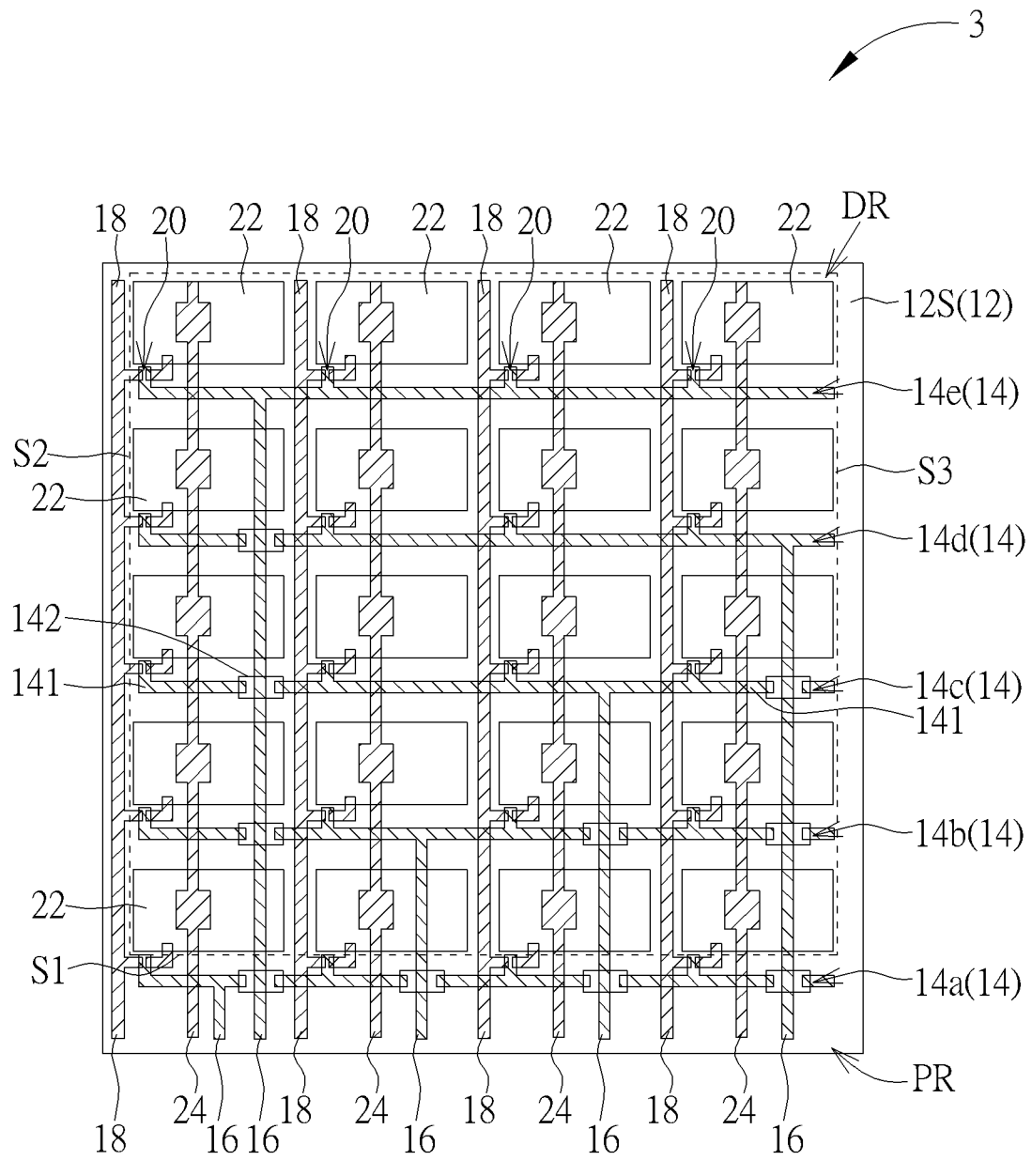
FIG. 6 schematically illustrates a plan view of an array substrate according to a third embodiment of the present invention.

FIG. 6 schematically illustrates a plan view of an array substrate according to a third embodiment of the present invention. As shown in FIG. 6, in the array substrate 3 of this embodiment, positions of the traces 16 in the first direction D1 may be adjusted according to the requirements. For example, the traces 16 respectively connected to the first signal line 14e to the first signal line 14a may not be limited to be arranged sequentially along the first direction D1. For example, one of the traces 16 connected to the first signal line 14e and another one of the traces 16 connected to the first signal line 14a may be disposed between one of the second signal lines 18 and one of the common lines 24 adjacent to each other. Alternatively, the traces 16 respectively connected to the first signal line 14a to the first signal line 14d may be arranged along the first direction D1, but not limited thereto. In some embodiments, the array substrate 3 shown in FIG. 6 may optionally adopt the structure of the gate driving circuit 26 and the data driving circuit 28 shown in FIG. 3. In some embodiments, other parts of the array substrate 3 shown in FIG. 6 may be similar or identical to the array substrates of other embodiments described above or below, and therefore are not described herein.

Figure 7:
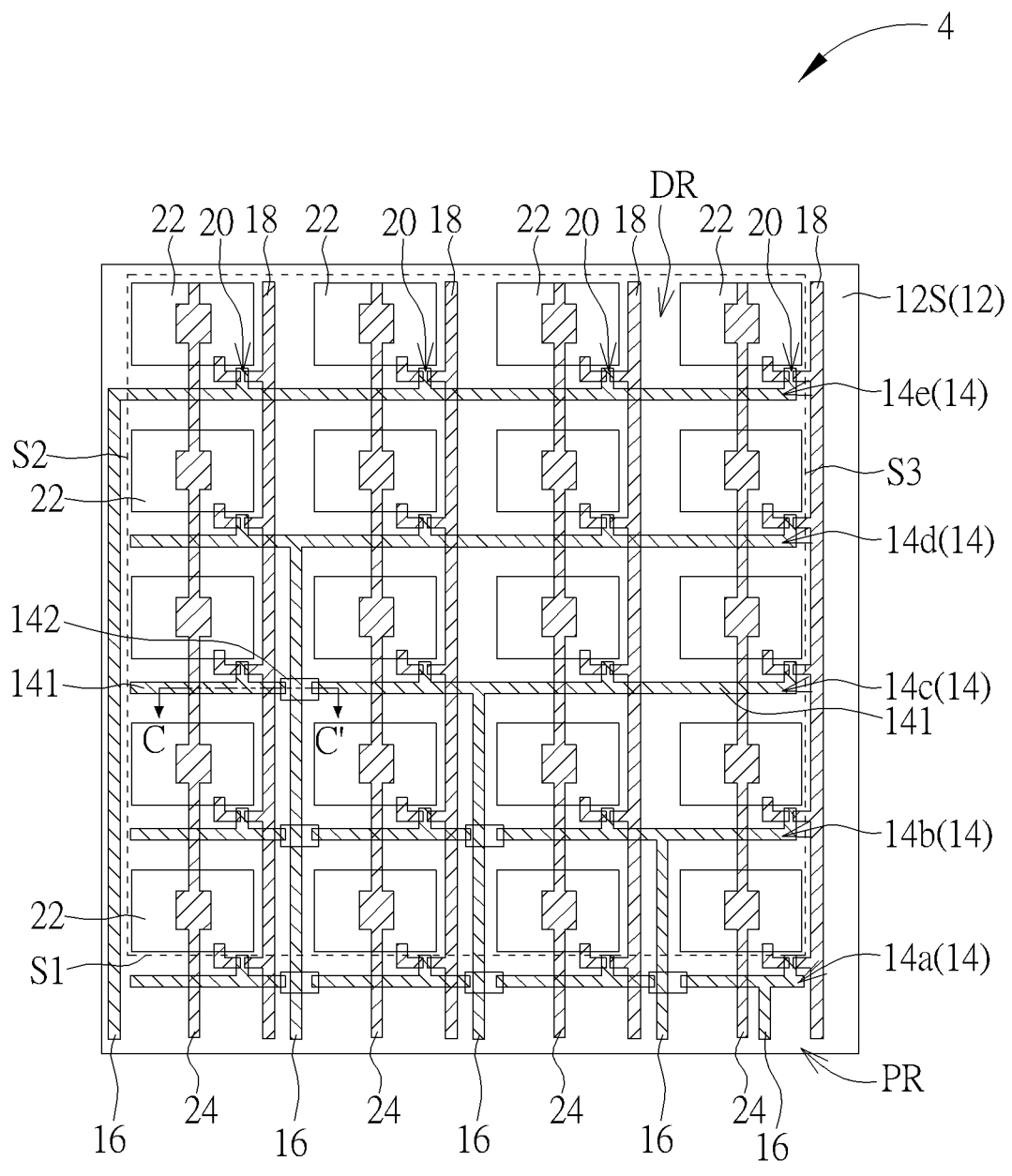
FIG. 7 schematically illustrates a plan view of an array substrate according to a fourth embodiment of the present invention.
Figure 8:
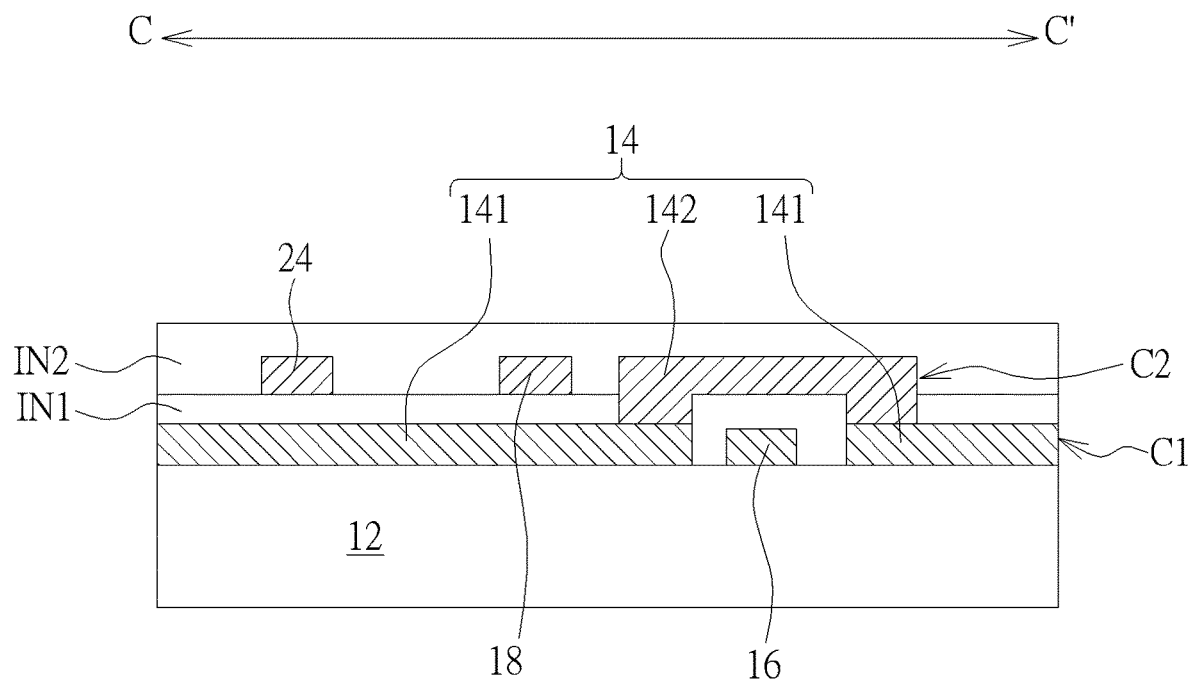
FIG. 8 schematically illustrates a cross-sectional view of FIG. 7 taken along a line C-C'.
Figure 8:
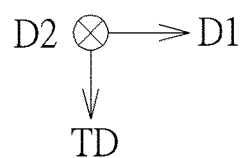

FIG. 7 schematically illustrates a plan view of an array substrate according to a fourth embodiment of the present invention, and FIG. 8 schematically illustrates a cross-sectional view of FIG. 7 taken along a line C-C'. As shown in FIG. 7 and FIG. 8, the difference between the array substrate 4 of this embodiment and the array substrate 1 shown in FIG. 1 is that the bridge segments 142 of this embodiment may be formed of the second conductive layer C2. In this case, the bridge segments 142 may be formed of the same second conductive layer C2 as the common lines 24 and the second signal lines 18, and one of the second signal lines 18 may cross one of the line segments 141 of the first signal lines 14. In some embodiments, the traces 16 shown in FIG. 7 may adopt the traces 16 shown in FIG. 4 or FIG. 6, but not limited thereto. In some embodiments, the second signal lines 18 of FIG. 7 may adopt the second signal lines 18 of FIG. 5. In some embodiments, the array substrate 4 shown in FIG. 7 may optionally adopt the structure of the gate driving circuit 26 and the data driving circuit 28 of FIG. 3. In some embodiments, other parts of the array substrate 4 of FIG. 7 may be similar or identical to the array substrates of the other embodiments described above or below, and thus are not described herein again.

Figure 9:
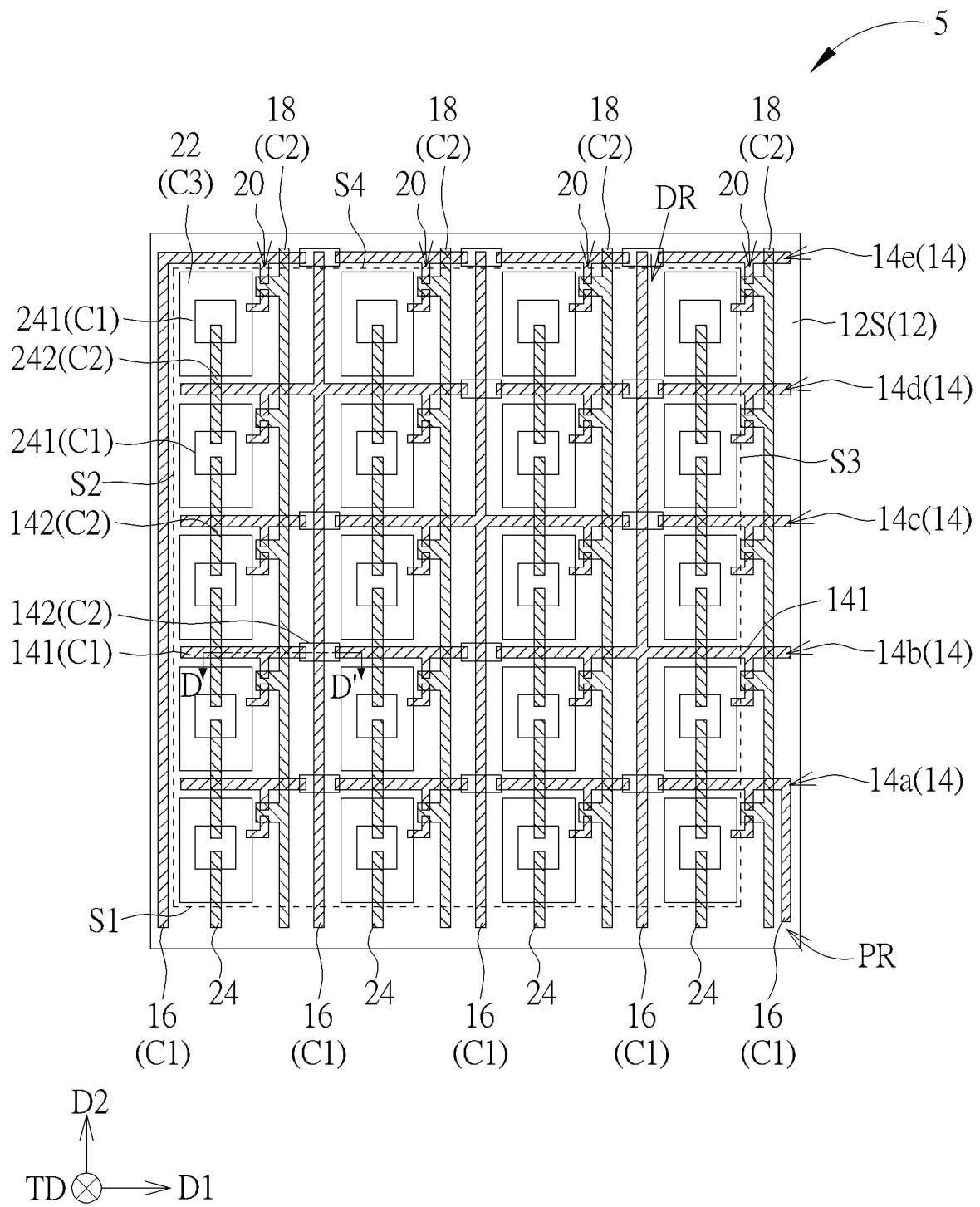
FIG. 9 schematically illustrates a plan view of an array substrate according to a fifth embodiment of the present invention.
Figure 10:
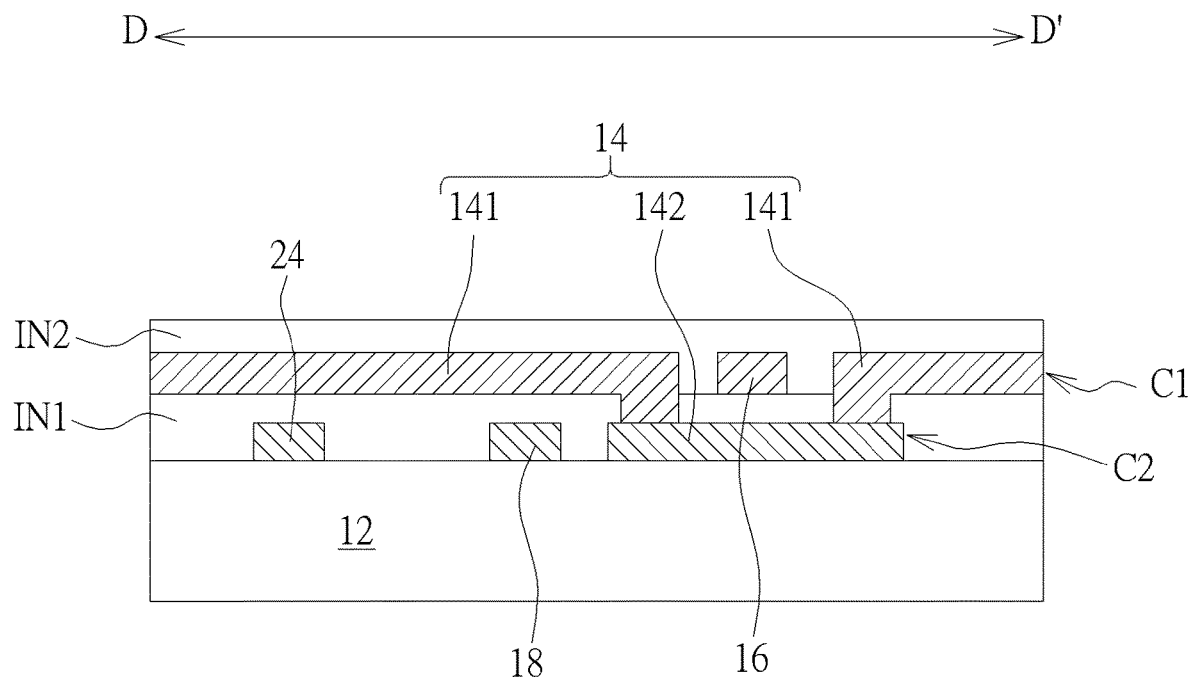
FIG. 10 schematically illustrates a cross-sectional view of FIG. 9 taken along a line D-D'.
Figure 10:
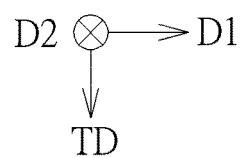

FIG. 9 schematically illustrates a plan view of an array substrate according to a fifth embodiment of the present invention, and FIG. 10 schematically illustrates a cross-sectional view of FIG. 9 taken along a line D-D'. As shown in FIG. 9 and FIG. 10, the difference between the array substrate 5 of this embodiment and the array substrate of FIG. 1 is that the first signal lines 14 and the second signal lines 18 of this embodiment may be data lines and scan lines, respectively. For example, the line segments 141 and the traces 16 of the first signal line 14 may be formed of the first conductive layer C1, the second signal lines 18 may be formed of the second conductive layer C2, and the second conductive layer C2 may be disposed on the substrate 12 and the first conductive layer C1, but not limited thereto. In the embodiment shown in FIG. 9 and FIG. 10, the bridge segments 142 may be formed of the second conductive layer C2 and located between the substrate 12 and the traces 16, but not limited thereto. In some embodiments, the bridge segments 142 may be formed of the third conductive layer C3 or another conductive layer different from the first conductive layer C1. In some embodiments, one of the bridge segments 142 may only cross one of the traces 16, or when the bridge segments 142 are formed of the third conductive layer C3 or another conductive layer different from the first conductive layer C1 and the second conductive layer C2, one of the bridge segments 142 may cross both one of the traces 16 and one of the second signal lines 18 adjacent to this trace 16. In some embodiments, each of the traces 16 may extend to the fourth side S4 of the display region DR opposite to the first side S1, so that the traces 16 may have substantially the same length. The structure of the traces 16 having the same length of FIG. 9 may be applied to the traces of any of the above-mentioned embodiments.

In the embodiment of FIG. 9 and FIG. 10, the common lines 24 may include electrodes 241 and connecting segments 242 alternately connected in sequence. The electrodes 241 may overlap the pixel electrodes 22 in the plan view direction TD respectively, and the connecting segments 242 may connect two adjacent electrodes 241. For example, when the line segments 141 of the first signal lines 14 are formed of the first conductive layer C1 disposed on the second conductive layer C2, the connecting segments 242 respectively crossing the line segments 141 may be formed of the second conductive layer C2 located between the substrate 12 and the first conductive layer C1, and the electrodes 241 may be formed of the first conductive layer C1, but not limited thereto. In some embodiments, all parts of the common lines 24 may be formed of the second conductive layer C2. In some embodiments, the line segments 141 of the first signal line 14 and the traces 16 may be formed of the second conductive layer C2, and the second signal lines 18 may be formed of the first conductive layer C1. In this case, the bridge segments 142 may be formed of the first conductive layer C1, the third conductive layer C3 or other conductive layer, and the connecting segments 242 of the common lines 24 may be formed of the first conductive layer C1. In some embodiments, the array substrate 4 shown in FIG. 9 may optionally adopt the structure of the gate driving circuit 26 and the data driving circuit 28 shown in FIG. 3. In some embodiments, other parts of the array substrate 5 of FIG. 9 may be similar or identical to the array substrates of the other embodiments described above, and therefore are not described herein again.

In summary, in the array substrate of the present invention, since most of the traces and the second signal lines may extend to the peripheral region through the first side of the display region, the number of the traces located in the peripheral region on the second side and the third side of the display region may be greatly reduced. Accordingly, widths of the peripheral region on the second side and the third side of the display region may be reduced, such that the display device may have narrow border. Moreover, since the traces and the second signal lines may be formed of different conductive layers, and/or the traces and the pixel electrodes may be formed of different conductive layers, the insulating layer may be disposed between the traces and the second signal lines and/or between the traces and the pixel electrodes. The coupling capacitances between the traces and the second signal lines and/or between the traces and the pixel electrodes may be reduced, thereby reducing abnormality of the display device. Therefore, the array substrate of the present invention may meet both the requirements of narrow border and improved display quality at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An array substrate, comprising:
   a substrate;
   a plurality of first signal lines disposed on the substrate along a first direction;
   a plurality of traces disposed on the substrate along a second direction different from the first direction, and one of the plurality of traces being electrically connected to one of the plurality of first signal lines, wherein the one of the plurality of traces crosses and is electrically insulated from another one of the plurality of first signal lines, and the plurality of traces are formed of a first conductive layer;
   a plurality of second signal lines disposed on the substrate along the second direction, wherein the plurality of second signal lines cross the plurality of first signal lines, and the plurality of second signal lines are formed of a second conductive layer different from the first conductive layer;
   a plurality of switching elements disposed on the substrate, wherein one of the plurality of switching elements is electrically connected to a corresponding one of the plurality of first signal lines and a corresponding one of the plurality of second signal lines; and
   a plurality of pixel electrodes and a plurality of common lines disposed on the substrate, wherein one of the plurality of common lines crosses a plurality of the plurality of pixel electrodes and the plurality of first signal lines, the plurality of common lines are formed of the second conductive layer, and the plurality of common lines are parallel to the plurality of second signal lines and the plurality of traces.

2. The array substrate according to claim 1, wherein the another one of the plurality of first signal lines comprises at least two line segments and at least one bridge segment, the at least one bridge segment is electrically connected between the at least two line segments, and the at least two line segments are formed of the first conductive layer.

3. The array substrate according to claim 2, wherein the at least one bridge segment is formed of a third conductive layer different from the first conductive layer and the second conductive layer.

4. The array substrate according to claim 2, wherein one of the plurality of second signal lines and the one of the plurality of traces cross the at least one bridge segment of the another one of the plurality of first signal lines.

5. The array substrate according to claim 2, wherein the at least one bridge segment is formed of the second conductive layer.

6. The array substrate according to claim 2, wherein the one of the plurality of traces crosses the at least one bridge segment of the another one of the plurality of first signal lines, and one of the plurality of second signal lines crosses one of the at least two line segments of the another one of the plurality of first signal lines.

7. The array substrate according to claim 2, wherein the plurality of pixel electrodes and the at least one bridge segment are formed of a third conductive layer different from the first conductive layer and the second conductive layer.

8. The array substrate according to claim 1, wherein the one of the plurality of traces crosses at least one of the plurality of pixel electrodes.

9. The array substrate according to claim 1, wherein the plurality of first signal lines are scan lines, and the plurality of second signal lines are data lines.

10. The array substrate according to claim 1, wherein the first conductive layer is disposed between the substrate and the second conductive layer.

11. The array substrate according to claim 1, wherein the plurality of first signal lines are data lines, and the plurality of second signal lines are scan lines.

12. The array substrate according to claim 11, wherein the second conductive layer is disposed between the first conductive layer and the substrate.

13. The array substrate according to claim 11, wherein each of the plurality of common lines comprises a plurality of electrodes and a plurality of connecting segments alternately connected to each other, and the plurality of connecting segments are formed of the second conductive layer.

14. The array substrate according to claim 2, wherein the plurality of pixel electrodes and the at least one bridge segment are formed of a third conductive layer different from the first conductive layer and the second conductive layer, gates of the plurality of switching elements are formed of the first conductive layer, the first conductive layer is disposed between the substrate and the second conductive layer, and the second conductive layer is disposed between the substrate and the third conductive layer.

15. The array substrate according to claim 14, wherein the third conductive layer comprises a transparent conductive material.

* * * * *